United States Patent [19]

Davidson

[11] Patent Number: 5,053,856
[45] Date of Patent: Oct. 1, 1991

[54] APPARATUS FOR PROVIDING ELECTRICAL CONDUITS IN COMPACT ARRAYS OF ELECTRONIC CIRCUITRY UTILIZING COOLING DEVICES

[75] Inventor: Howard L. Davidson, San Carlos, Calif.

[73] Assignee: Sun Microsystems, Inc., Mountain View, Calif.

[21] Appl. No.: 577,432

[22] Filed: Sep. 4, 1990

[51] Int. Cl.5 ............... H01L 25/04; H01L 23/16; H01L 39/02; H01L 23/02
[52] U.S. Cl. .................... 357/82; 357/75; 357/80; 357/74; 361/382; 361/388; 174/15.1; 165/80.4; 165/104.33
[58] Field of Search ............ 357/75, 81, 82, 80, 357/74; 361/382, 388; 174/16.3, 15.1; 165/80.4, 104.33

[56] References Cited

U.S. PATENT DOCUMENTS

| | | | |
|---|---|---|---|
| 3,528,492 | 9/1970 | Austin | 361/382 |
| 4,631,573 | 12/1986 | Sutrina | 357/82 |
| 4,631,636 | 12/1986 | Andrews | 361/385 |
| 4,841,355 | 6/1989 | Parks | 357/82 |

*Primary Examiner*—Rolf Hille
*Assistant Examiner*—D. Ostrowski
*Attorney, Agent, or Firm*—Blakely Sokoloff Taylor & Zafman

[57] ABSTRACT

An arrangement for packaging thin planar arrays of circuit components including a plurality of essentially thin parallel layers in which the layers lie closely adjacent one another, one or more of the layers including a substrate of insulating material having circuit board means imbedded therein, the improvement including heat-conducting means positioned against at least one of the layers for removing heat from the arrangement, the heat-conducting means having an interior channel for transferring a fluid to accomplish the heat removal, and means providing electrical conduits through the heat-conducting means.

7 Claims, 3 Drawing Sheets

APPARATUS FOR PROVIDING ELECTRICAL CONDUITS IN COMPACT ARRAYS OF ELECTRONIC CIRCUITRY UTILIZING COOLING DEVICES

BACKGROUND OF THE INVENTION

1. Field of the Invention

This invention relates to computer systems and, more particularly, to apparatus for providing electrical connections used between layers of very high density hybrid electronic circuits.

2. History of the Prior Art

The semiconductor and other devices utilized in modern computer systems function correctly only when operating within specified temperature ranges. In general, the components are designed to operate reliably within a relatively narrow range which may extend to about 110 degrees C. at the upper limit. Above this point, the devices themselves are unreliable in handling digital information and may well be destroyed as the temperature rises. Typically, desktop computer systems such as personal computers and work stations include a motherboard upon which are positioned a central processing unit, memory, and input/output circuitry connected to a system bus. Slot connections are provided to the system bus on the motherboard for system peripheral components. Ambient air, often driven by small fans installed within the case of the computer, is usually sufficient to cool the electronic circuitry to appropriate operating temperatures.

An entirely different packaging arrangement which is the subject of copending patent application Ser. No. 07/553,521, entitled *Three Dimensional Packaging Arrangement for Computer Systems and the Like*, filed July 13, 1990, H. Davidson, allows a very powerful computer (e.g., one with up to 0.5 gigabytes of random access storage and as many as four individual processors) to be contained in a volume approximately four inches on a side and one inch thick. Such a compact arrangement is obtained by placing very thin layers of hybrid circuits, essentially against one another to form a total computer package. Such a powerful computer is capable of operating at faster speeds than conventionally-packaged computers because the short lengths of conductors used for buses substantially reduce impedances. However, the higher packing densities of these arrangements have tended to raise the operating temperatures to levels which normal ambient air cooling cannot handle.

For example, in order to obtain very fast operating speeds from such a computer, very high speed devices may be used in the embedded chips. These devices require a great deal of power and produce very high operating temperatures. With such a system, as much as two hundred amperes of current may be utilized at each layer of electronic devices, producing as much as one thousand watts of power at each of a number of the layers of the arrangement. Prior art cooling techniques will simply not keep a computer of this sort within the operating temperature limits of its electronic devices, and the apparatus will be destroyed within a very short time after power is applied.

In order to remove the heat from such arrangements in higher power uses, a novel arrangement of heat exchange units has been devised. Such an arrangement is disclosed in U.S. patent application Ser. No. 07/553,541, entitled *Apparatus For Cooling Compact Arrays Of Electronic Circuitry*, H. Davidson, filed July 13, 1990. Basically, the heat exchange units comprise at least one heat-removing layer positioned between and against at least one of the layers carrying electronic devices. The heat-removing layers are arranged with an interior channel for transferring a fluid to accomplish the heat removal. Tests have shown that such a heat exchanger is capable of cooling a single layer of circuitry consuming more than five hundred watts of power to approximately 47 degrees C. at the surface of the heat exchanger.

Such arrangements work well in situations in which the conductors electrically connecting the layers of electronic circuitry are routed through ceramic and other non-conductive insulators which provide structural positioning for all of the layers. However, the number of conductors necessary to such circuitry tends to proliferate in very powerful computers. Consequently, structural arrangements for providing electrical conduits between layers are drastically limited in high powered computers requiring the use of heat removal devices such as those disclosed in the last above-mentioned patent application.

SUMMARY OF THE INVENTION

It is, therefore, an object of the present invention to provide an arrangement for furnishing electrical conduits in a very densely packed computer system having layers of heat removal devices.

It is another, more general, object of the present invention to provide electrical conduits through arrangements which cool very densely packed electronic systems.

These and other objects of the present invention are realized in an arrangement for packaging thin planar arrays of circuit components including a plurality of essentially thin parallel layers in which the layers lie closely adjacent one another, one or more of the layers comprising a substrate of insulating material having circuit board means imbedded therein, others of said layers comprising heat-conducting means positioned against at least one of the other layers for removing heat from the arrangement, the heat-conducting means having an interior channel for transferring a fluid to accomplish the heat removal, the layers comprising heat-conducting means having openings therein for containing electrical conduits, the openings intersecting the layers comprising heat-conducting means essentially at right angles to the flow of the inert fluid through the interior channel and positioned in a manner to avoid the channel.

These and other objects and features of the invention will be better understood by reference to the detailed description which follows taken together with the drawings in which like elements are referred to by like designations throughout the several views.

DETAILED DESCRIPTION OF THE INVENTION

Figure 1:
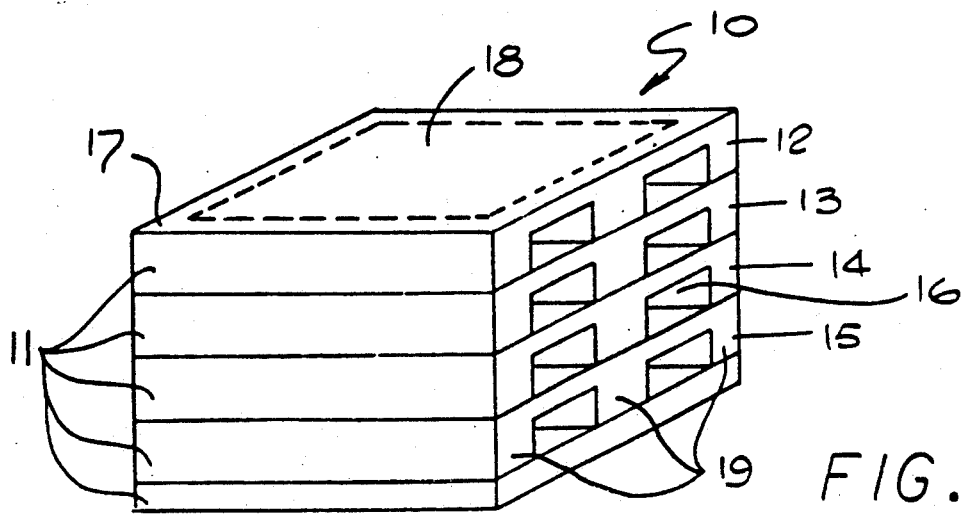
FIG. 1 is an isometric diagram illustrating a densely packed computer packaging design described in a copending patent application.

Referring now to FIG. 1, there is illustrated an isometric view of a packaging arrangement disclosed in copending U.S. Pat. application Ser. No. 07/553,521, entitled *Three Dimensional Packaging Arrangement for Computer Systems and the Like*, filed July 13, 1990, H. Davidson. The packaging arrangement includes a plurality of individual layers of circuit elements. Each of these individual layers 11 of circuit elements, in general, is comprised of integrated circuits which cooperate together to form one or more components of a computer or other digital system. For example, a first layer 12 may be a central processor for a computer, a second layer 13 and a third layer 14 may both be random access memory for the computer, and a fourth layer 15 may consist of input/output circuitry for the computer. As explained in the above-mentioned patent application, each of the layers 11 comprises integrated circuits embedded in an insulating substrate. The layers 11 are all constructed to have opposing major surfaces, in general, parallel to one another so that a plurality of the layers may be placed together and joined to form a very densely packed system.

Each of the planar layers 11 of the arrangement 10 may be constructed using any technology which is capable of providing flat and parallel top and bottom surfaces. A presently preferred technology uses a single flat sheet of ceramic material as a substrate into which are carved recesses for receiving integrated circuit chips. The chips and the pocketed substrate layer are covered on one side with very thin flat layers of high temperature plastic material each of which has holes through it to allow connections to be made directly to the chips lying in the pockets. Connectors are placed in the holes and an interconnect pattern is described on the individual layers of plastic material to form a multi-layer interconnect. Conductive pads may be placed on the upper one of the plastic layers. The conductors of the interconnect are joined through the pads to conductors which form busing paths passing through the substrate. In a preferred embodiment, the substrate 18 is placed in an insulating shell 17. The shell 17 has rails 19 in which are embedded conductors for continuing the busing between the layers 11. The rails 19 form openings 16 which allow ambient air to circulate adjacent the layers 11. Using the technology described in the co-pending patent application, individual layers of less than 0.050 inches in thickness are produced.

This packaging arrangement offers a number of advantages in addition to its small size. It provides substantially more access to the embedded chips than in the usual connector arrangement of the prior art in which a chip has connector terminals only around its periphery. The length of the conductors which function as computer buses between the layers is extremely short thereby providing very low impedance and, consequently, minimal access times. Exemplary values of 0.5 nanohenries of inductance per connector, a few milliohms of resistance, and 5 picofarads of capacitance are to be expected. Such short conductors cut down the busing time to access circuit elements to an insignificant fraction of the time required in prior art computers.

Although this basic arrangement provides for the circulation of air to cool the arrangement where the system is a relatively commonplace computer, this method provides insufficient cooling where the system includes very fast components requiring a great deal of power and generating a great deal of heat in operation. In order to remove the heat from the arrangement 10 in such higher power uses, a novel arrangements of heat exchange units has been devised. Such an arrangement is disclosed in U.S. patent application Ser. No. 07/553,541, entitled *Apparatus For Cooling Compact Arrays Of Electronic Circuitry*, Davidson, filed July 13, 1990. Such an arrangement of heat exchange units includes individual layers of heat conductive devices which are normally positioned between the layers 11 of the arrangement 10 holding the high powered electronic circuitry. Each of the heat conductive devices is provided with conduits therethrough for carrying a fluid for removing the heat from the adjacent layers of electronic circuits. Each of the heat conductive devices may be constructed of a metal such as copper which provides efficient heat transfer yet may be as thin as 0.050 inches while providing a conduit for the heat conducting fluid. When placed within the slots 16 formed for carrying air in the arrangement 10 of FIG. 1, the heat exchange units lie with one broad flat side of the heat conductive device abutted against a thin layer of ceramic upon which the hybrid chips are placed and with the other side against an insulating layer covering the multi-layer interconnect to the upper surface of a chip.

The fluid conduit which transfers the fluids used to remove the heat from the circuitry may be formed by etching individual top and bottom plates of which the heat conductive device is formed. The etching provides upstanding ridges which separate grooves to form the conduits. Fluid is injected into the heat exchanger at a first opening, traverses the internal conduit, and is removed from the heat exchange device at a second opening. Conduits may be joined to the openings for providing fluid access thereto and for joining individual heat conductive devices together. A pump and heat disposal arrangement such as a refrigerating device may be connected in the fluid line to the pipes to move fluid through the heat exchange units and remove the heat from the fluid.

A plurality of heat exchange units may be joined to transfer fluid in parallel to cool an entire arrangement 10. The individual heat exchange devices may each have an opening at one end of the internal conduit and be connected in parallel with the other heat exchange devices to a source of fluid such as a pump. The other end of the conduit of each heat exchange device may be connected to a return system by which the fluid may be cooled before being pumped through the heat-exchange units again.

Figure 2:
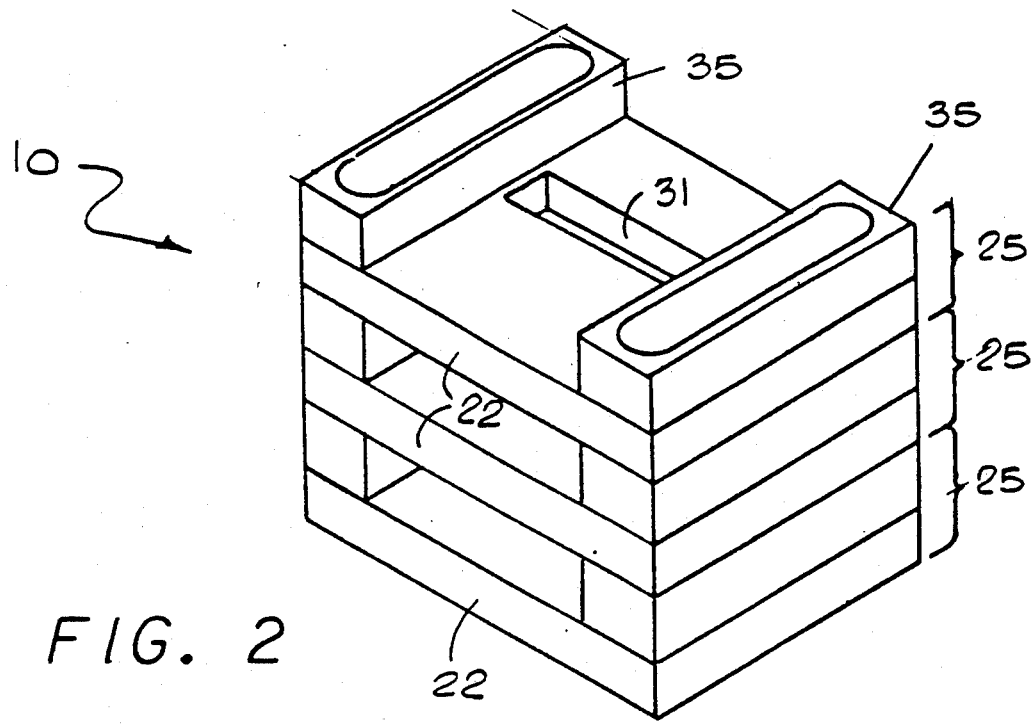
FIG. 2 is an isometric diagram illustrating layers of heat-exchange units described in copending patent application for use in densely packed computer packaging design.
Figure 3:
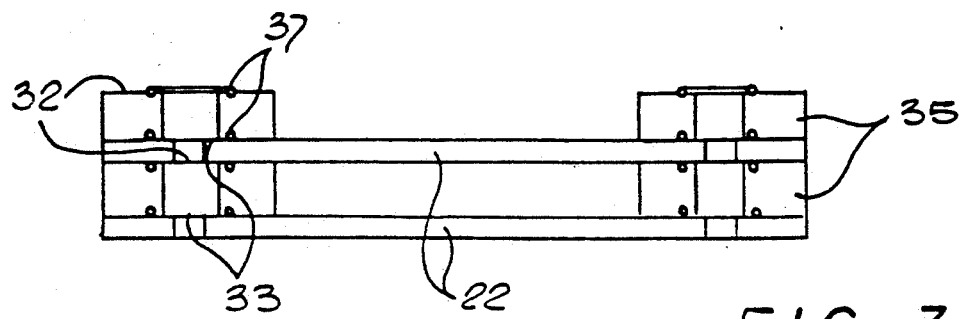
FIG. 3 is a cross sectional view of a pair of the heat-exchange units shown in FIG. 2.

FIG. 2 illustrates a preferred embodiment of the invention of the copending patent application in which a plurality of heat exchange units 25 are joined together to cool an entire arrangement 10. The individual heat exchange devices 22 of the units 25 each have an opening 31 adapted to fit around the central depending rail 19 of the shell 17 so that the heat exchange units 25 lie against both adjoining layers 11. As shown in the cross-sectional view of FIG. 3, the individual heat exchange devices 22 each have an opening 32 at each end of a projecting upper surface and an opening 33 at each end of a lower surface. The openings 32 and 33 of adjoining heat exchange units 25 are designed to abut the surface of a carrier sheet 35 which has an opening therein of essentially the same size as the openings 32 and 33. Each surface of the carrier sheet 35 is grooved to hold an O ring or other seal 37 around each opening in the carrier sheet 35. Thus when the heat exchange units 25 are clamped together as the arrangement 10 is formed, each opening 32 and 33 is forced tightly against the opening in one of the carrier sheets 35 so that a manifold is formed which joins the interior of the heat exchange devices 22 together. This arrangement allows coolant to be transferred from the pump to each heat exchange unit 25 in parallel to make more efficient use of the heat exchange units 25. The heat exchange units 25 may then be connected into a heat exchange path with a pump and heat removal device in the manner discussed.

Although the arrangements of heat exchange units 25 illustrated in FIG. 2 accomplish the ready removal of heat from the arrangement, the layers of heat exchange devices 22 block the paths through which many electrical conductors might normally be routed. As may be seen from FIGS. 1 and 2, the only routes for conductors between the layers 11 are the side and central rails 19 of the ceramic material which forms the shells 17 for holding the layers of electronic devices and heat exchange units. The more powerful computers which require heat exchange units of the type described herein often have more individual elements and require more electrical paths between layers of components than can be routed through these rails 19. Consequently, there is a need for an improved arrangement to provide such conduits.

Figure 4:
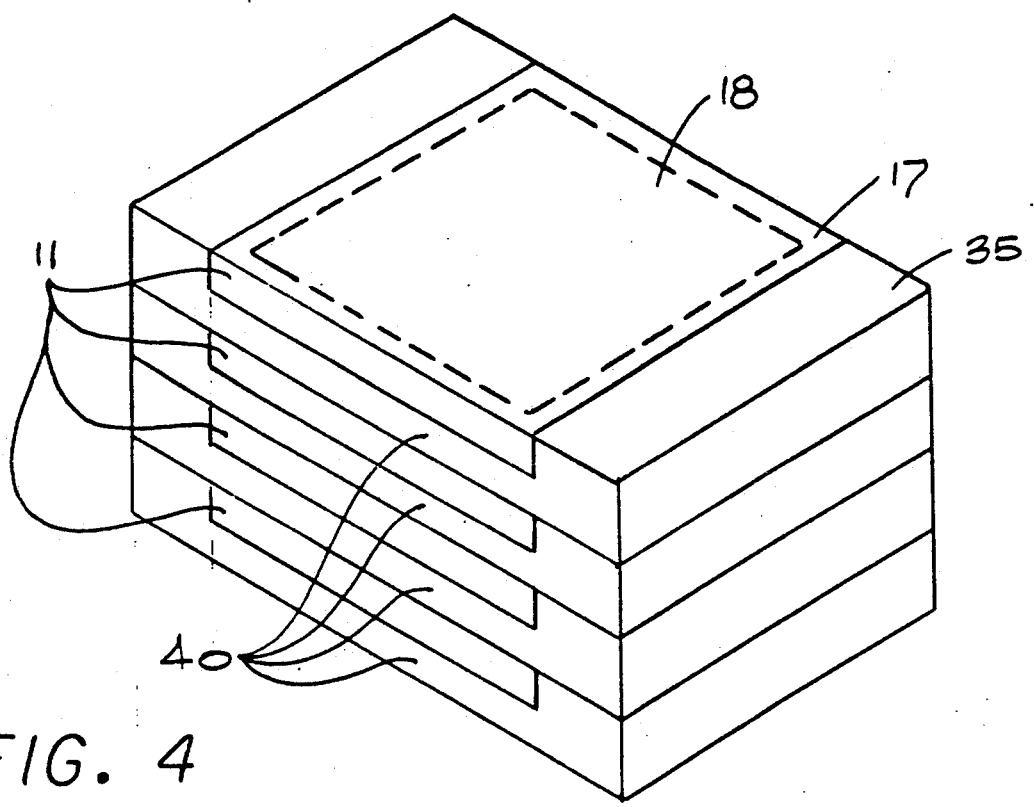
FIG. 4 is an isometric view of an improved densely packed computer system in accordance with the present invention.

FIG. 4 is an isometric view illustrating an improved computer system designed in accordance with the present invention. The computer system includes a plurality of layers 11 of electronic components designed in accordance with the teaching of U.S. patent application Ser. No. 07/553,521, entitled *Three Dimensional Packaging Arrangement for Computer Systems and the Like*, filed July 13, 1990, H. Davidson. In contrast to the layers 11 illustrated in the computer of FIG. 1, the component devices contained in the substrates 18 of the layers 11 are embedded in shells 17 which have no rails depending from the lower surfaces. The layers 11 are interleaved and divided from one another by layers of heat exchange units 40 designed generally in accordance with the teaching of U.S. patent application Ser. No. 07/553,541, entitled *Apparatus For Cooling Compact Arrays Of Electronic Circuitry*, H. Davidson, filed July 13, 1990. However, in contrast to the heat exchange units disclosed therein, the heat exchange devices of the heat exchange units 40 have the same exterior dimensions as the layers 11. Thus, the arrangement which is a computer appears essentially as a solid box formed of layers of electronic circuits and layers of heat exchange units. Projecting from opposite sides of the box are the carrier sheets 35 forming the manifolds which interconnect the heat exchange devices of the heat exchange units 40 together. It will be recognized that the form of the computer is such that the provision of rails of ceramic material through which busing conductors pass has been eliminated.

Figure 5:
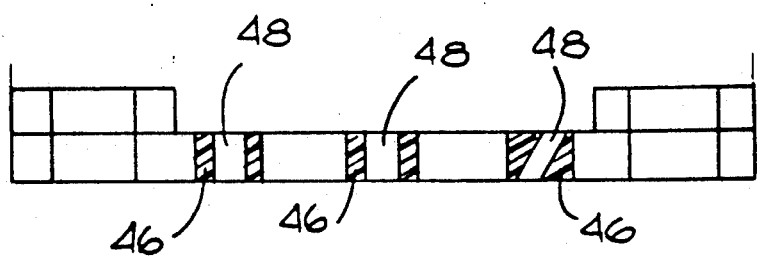
FIG. 5 is a cross-sectional side view illustrating one layer of an improved heat exchange unit constructed in accordance with the invention.
Figure 6:
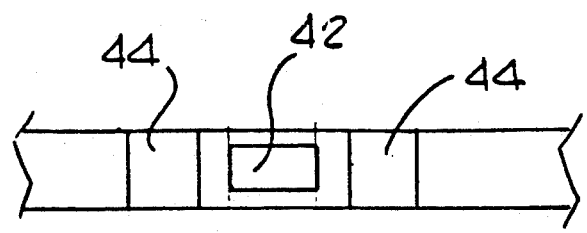
FIG. 6 is a cross-sectional front view illustrating one layer of an improved heat exchange unit constructed in accordance with the invention.
Figure 7:
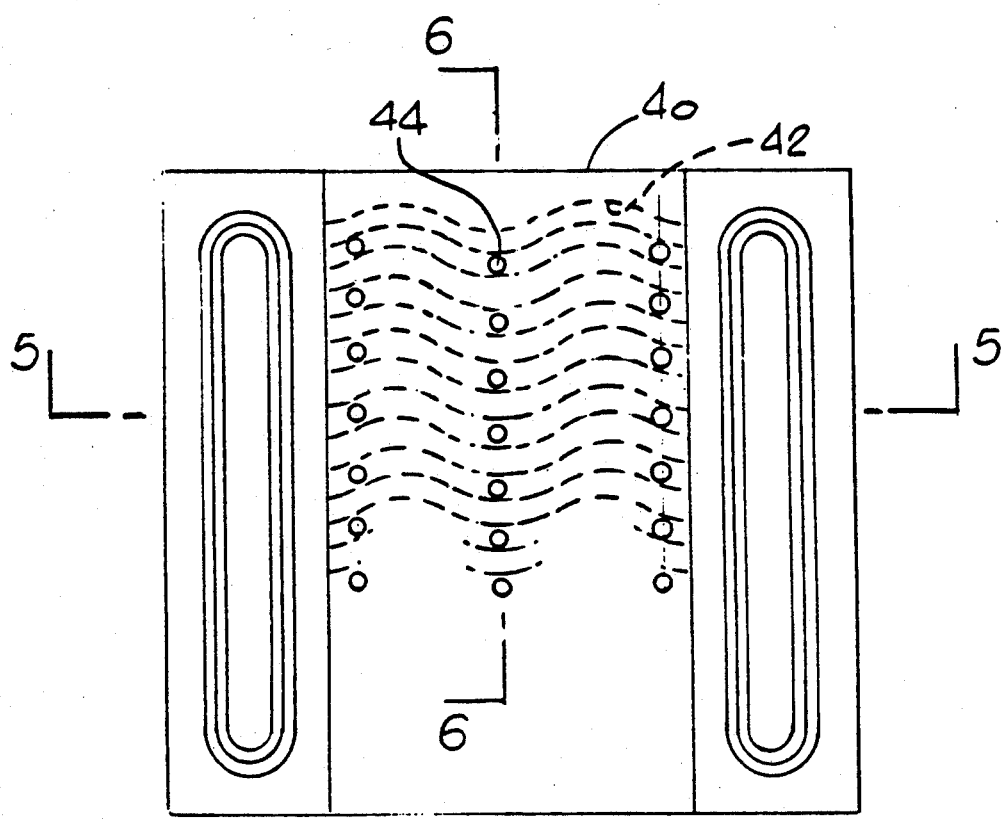
FIG. 7 is a top view illustrating one layer of an improved heat exchange unit constructed in accordance with the invention.

FIGS. 5, 6, and 7 illustrate individual improved heat exchange devices 40 designed in accordance with the present invention. The heat exchange device 40 is designed with interior fluid conducting paths 42 illustrated by the dotted lines shown. In a preferred embodiment of the invention, these paths 42 may be serpentine in configuration as is illustrated in FIG. 7. A number of openings 44 are placed in the heat exchange device 40. These openings are selectively placed to run from flat surface to opposing flat surface of the heat exchange device 40 and are usually, but not necessarily, orthogonal to both of the surfaces. Each of these openings is selectively placed to intersect the top and bottom sheet of the heat exchange device 40 at one of the solid ridges separating the fluid conducting paths 42 thereby avoiding those fluid conducting paths within the interior of the heat exchange device 40. The fluid carrying interior paths 42 thus remain intact and sealed to the openings 44. Consequently, each of the openings 44 may provide a conduit for an electrical conductor or conductors joining two layers of the arrangement containing electronic devices.

In a preferred embodiment of the invention, the fluid channels through the heat exchange device 40 may be approximately 20 millimeters in diameter and provide an undulating pattern or other pattern adapted to best cool the surface of the device 40. The openings may be approximately 40 millimeters in diameter and separated from the interior wall of any fluid conduit by approximately 10 millimeters. It is estimated that approximately one hundred such openings through the device 40 may thus be placed in any one square inch of surface.

In a presently preferred embodiment of the invention, a plastic sleeve 46 may be placed in each of the openings 44 and a conductor 48 which provides spring contact with each of the upper and lower adjoining surfaces of the electronic-containing layers 11 may be inserted in the plastic sleeve. Such conductors 48 are well known to the prior art; one type of such conductor is available commercially as a "CinApse" conductor, manufactured by Cinch Connectors. If it is desired that the particular conductor 48 be grounded to the heat exchange layer, the plastic material may be omitted from the opening and the opening made smaller so that the conductor 48 bears against the metal surface of the opening.

In particular instances, it may be desirable that the electrical conductors 48 travel in a direction through the heat exchange devices at angles other than orthogonal to the surface. In such a case, the openings 44 may be selected to accept plastic sleeves at an orthogonal to the flat surfaces while the sleeves 46 hold the electrical conductors 48 at other than an orthogonal as is shown in the rightmost depiction in FIG. 5. Such an arrangements makes the manufacture of the heat exchange units much more simple than would be expected since only openings orthogonal to the flat surfaces need be placed in the heat exchange layers.

In order to enhance the heat exchanging ability of the layers of heat exchange devices, it may be desirable to utilize various thermally-conductive compounds between the various layers of the arrangement 10. For example, solder, heat-conductive adhesives, heat-conductive grease, and other such compounds may be used to advantage between the various layers of such a computer system.

Figure 8:
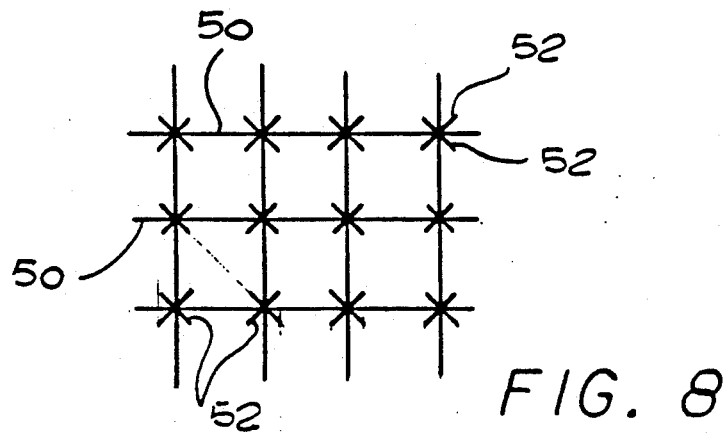
FIG. 8 illustrates a top view of a spring arrangement for providing conductive connection between a heat exchange unit and an adjoining electronic layer.
Figure 9:
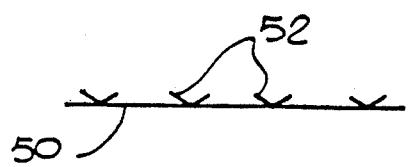
FIG. 9 illustrates a side view of the spring arrangement of FIG. 7 for providing conductive connection between a heat exchange unit and an adjoining electronic layer.

If it is desired to provide grounding connections to a particular heat exchange device at other than the openings 44, a spring arrangement such as that shown in FIG. 8 may be arranged between an individual heat exchange device and the adjoining electronic-bearing layer 11. The spring 50 may be fabricated by photoetching a metal foil to leave a square or rectangular grid with tabs 52 extending from the diagonals of the grid. Other patterns might also be used depending on the particular grounding connections to be made. The tabs 52 are deformed out of the plane of the grid as illustrated in FIG. 9 to provide spring loaded contact points which may bear against metallization on the electronic layers. In order to contain the grounding spring 50 during assembly of the arrangement, channels may be etched in the outer surface of the heat exchange units.

As with the arrangement of layers of devices discussed in copending patent application Ser. No. 07/553,521, entitled *Three Dimensional Packaging Arrangement for Computer Systems and the Like*, referred to above, various methods of keying the exact positioning for providing precise alignment between the layers may be included as a part of each of the layers of electronic circuitry and heat exchange devices to assure the registration of the various components of the layers. Such methods been discussed in detail in the above-mentioned patent application and are not discussed further here.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. In an arrangement for packaging planar arrays of circuit components comprising a plurality of essentially parallel layers in which the layers lie adjacent one another, one or more of the layers comprising a substrate of insulating material having circuit board means imbedded therein, heat exchange means positioned against at least one of the layers for removing heat from the arrangement comprising at least one substantially planar heat exchanger abutted against one of the layers, and means for transferring a fluid through the heat exchanger having integral walls to prevent fluid leakage, the improvement comprising conduits for electrical connectors through the heat exchange means, the conduits for electrical connectors being positioned to bypass any interior passages for conducting fluids to remove heat from the arrangement.

2. In an arrangement for packaging planar arrays of circuit components as claimed in claim 1, the conduits for electrical connectors through the heat exchange means comprising openings in the heat exchanger essentially orthogonal to the surface thereof, and conductors positioned in the openings.

3. In an arrangement for packaging planar arrays of circuit components as claimed in claim 2, the conductors positioned in the openings being insolated from edges of the opening.

4. In an arrangement for packaging planar arrays of circuit components as claimed in claim 3, the conductors positioned in the openings at an angle other than orthogonal to the surface of the heat exchanger.

5. In an arrangement for packaging planar arrays of circuit components as claimed in claim 1, a spring member positioned between one of the layers and a heat exchanger for providing electrical contact therebetween.

6. In an arrangement for packaging planar arrays of circuit components as claimed in claim 5, the spring member positioned between one of the layers and a heat exchanger being formed from an etched planar sheet, and having ends bent out of the plane of the sheet.

7. An arrangement of circuit components comprising a plurality of substantially parallel layers in which the layers lie adjacent one another, one or more of the layers comprising a substrate of insulating material having circuit board means imbedded therein, another of the layers comprising means for removing heat from the arrangement, the means for removing heat from the arrangement comprising at least one substantially planar heat exchanger abutted against one of the layers, means for transferring a fluid through the heat exchanger having integral walls to prevent fluid leakage, and means for providing electrical paths through the heat exchanger for connecting the circuit board means of one layer to the circuit board means of another layer.

* * * * *

UNITED STATES PATENT AND TRADEMARK OFFICE
CERTIFICATE OF CORRECTION

PATENT NO.   :   5,053,856
DATED        :   10/1/91
INVENTOR(S)  :   Davidson

It is certified that error appears in the above-identified patent and that said Letters Patent is hereby corrected as shown below:

| | | |
|---|---|---|
| col. 06, line 34 | delete "millimeters" | insert --mils-- |
| col. 06, line 37 | delete "millimeters" | insert --mils-- |
| col. 06, line 39 | delete "millimeters" | insert --mils-- |
| col. 07, line 32 | after "methods" | insert --have-- |

Signed and Sealed this

Eighth Day of June, 1993

Attest:

MICHAEL K. KIRK

Attesting Officer        Acting Commissioner of Patents and Trademarks